(12) United States Patent
Guo et al.

(10) Patent No.: US 11,495,647 B2
(45) Date of Patent: Nov. 8, 2022

(54) DISPLAY PANEL, DISPLAY SUBSTRATE THEREOF AND METHOD OF MAKING THE SAME

(71) Applicants: Chengdu BOE Optoelectronics Technology Co., Ltd., Chengdu (CN); BOE Technology Group Co., Ltd., Beijing (CN)

(72) Inventors: Yonglin Guo, Beijing (CN); Tingliang Liu, Beijing (CN); Kai Zhang, Beijing (CN); Yuan Yao, Beijing (CN); Yi Zhang, Beijing (CN)

(73) Assignees: Chengdu BOE Optoelectronics Technology Co., Ltd., Sichuan (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 332 days.

(21) Appl. No.: 16/492,936

(22) PCT Filed: Feb. 2, 2019

(86) PCT No.: PCT/CN2019/074626
§ 371 (c)(1),
(2) Date: Sep. 10, 2019

(87) PCT Pub. No.: WO2020/073571
PCT Pub. Date: Apr. 16, 2020

(65) Prior Publication Data
US 2021/0335944 A1 Oct. 28, 2021

(30) Foreign Application Priority Data
Oct. 8, 2018 (CN) .......................... 201811167165.2

(51) Int. Cl.
*H01L 27/32* (2006.01)
*H01L 25/18* (2006.01)
(Continued)

(52) U.S. Cl.
CPC ...... *H01L 27/3258* (2013.01); *G06V 40/1318* (2022.01); *H01L 25/18* (2013.01);
(Continued)

(58) Field of Classification Search
CPC ............. H01L 27/2372; H01L 27/2334; H01L 27/14623; H01L 27/14629; H01L 33/60; G06K 9/0004
See application file for complete search history.

(56) References Cited

U.S. PATENT DOCUMENTS 5,666,177 A * 9/1997 Hsieh ................ G02F 1/133512
349/106
6,734,463 B2 * 5/2004 Ishikawa ........... H01L 29/78633
257/434
(Continued)

FOREIGN PATENT DOCUMENTS

CN 106298859 A 1/2017
CN 107103307 A 8/2017
(Continued)

OTHER PUBLICATIONS

PCTCN2019074626-ISR.
CN2018111671652 first office action.

*Primary Examiner* — David A Zarneke
(74) *Attorney, Agent, or Firm* — IPro, PLLC

(57) ABSTRACT

Disclosed herein is a display substrate of a display panel, comprising: a support; a second layer on the support; a window extending through the second layer and optically coupled with an image sensor; and a sidewall at least partially surrounding the window; wherein the sidewall is
(Continued)

configured to attenuate transmission of light through the sidewall.

20 Claims, 21 Drawing Sheets

(51) Int. Cl.
    *H01L 33/60*     (2010.01)
    *H01L 51/56*     (2006.01)
    *H04N 5/225*     (2006.01)
    *G06V 40/13*     (2022.01)

(52) U.S. Cl.
    CPC ...... *H01L 27/3234* (2013.01); *H01L 27/3272* (2013.01); *H01L 27/3276* (2013.01); *H01L 33/60* (2013.01); *H01L 51/56* (2013.01); *H04N 5/2257* (2013.01); *H01L 2227/323* (2013.01)

(56) References Cited

U.S. PATENT DOCUMENTS

| | | | |
|---|---|---|---|
| 10,535,721 B2 * | 1/2020 | Puszka | H01L 27/3276 |
| 10,636,931 B1 * | 4/2020 | Shibata | H01L 31/03682 |
| 10,762,326 B2 * | 9/2020 | Zhu | H01L 27/3246 |
| 10,763,321 B2 * | 9/2020 | Ma | H01L 27/3258 |
| 10,825,875 B2 * | 11/2020 | Zhao | H01L 27/3246 |
| 10,825,881 B2 * | 11/2020 | Sun | H01L 27/3272 |
| 10,943,082 B2 * | 3/2021 | Jang | G06F 3/0421 |
| 10,978,537 B2 * | 4/2021 | Ebisuno | H01L 27/3276 |
| 11,037,012 B2 * | 6/2021 | Schwartz | H01L 27/14678 |
| 11,075,256 B2 * | 7/2021 | Yan | G06K 9/0004 |
| 2002/0190321 A1 | 12/2002 | Yamazaki et al. | |
| 2009/0002341 A1 | 1/2009 | Saito et al. | |
| 2019/0033976 A1 | 1/2019 | Cao et al. | |
| 2019/0156097 A1 | 5/2019 | Liu et al. | |
| 2019/0172886 A1 | 6/2019 | Ma et al. | |
| 2019/0172887 A1 | 6/2019 | Sun et al. | |
| 2019/0354789 A1 | 11/2019 | Gu et al. | |

FOREIGN PATENT DOCUMENTS

| | | | |
|---|---|---|---|
| CN | 107436685 A | | 12/2017 |
| CN | 107845666 A | | 3/2018 |
| CN | 107977632 A | | 5/2018 |
| CN | 107978624 A | | 5/2018 |
| CN | 108258017 A | | 7/2018 |
| CN | 112701224 A | * | 4/2021 |
| JP | 2008305154 A | | 12/2008 |

* cited by examiner

DISPLAY PANEL, DISPLAY SUBSTRATE THEREOF AND METHOD OF MAKING THE SAME

CROSS-REFERENCE TO RELATED APPLICATION

This application claims priority to Chinese Patent Application No. 201811167165.2, filed on Oct. 8, 2018, the contents of which are incorporated by reference in the entirety.

TECHNICAL FIELD

The disclosure herein relates to the field of display technology, and in particular, to a display panel, a display substrate thereof, and a method for making the same.

BACKGROUND

In recent years, with the rapid development of display technology, terminal devices with biometric functions have gradually become necessities in life. Among them, fingerprint recognition by virtue of its unique identity is widely used in various terminal devices to increase user security.

SUMMARY

Disclosed herein is a display substrate of a display panel, comprising: a support; a second layer on the support; a window extending through the second layer and optically coupled with an image sensor; and a sidewall at least partially surrounding the window; wherein the sidewall is configured to attenuate transmission of light through the sidewall. The light may be emitted by the display substrate.

According to an embodiment, the display substrate further comprises a first layer; wherein the second layer is sandwiched between the first layer and the support.

According to an embodiment, the display substrate further comprises a pinhole layer with patterns defining a pinhole.

According to an embodiment, the window is optically coupled with the image sensor through the pinhole.

According to an embodiment, the pinhole layer comprises a layer of material that is opaque to the light.

According to an embodiment, the pinhole layer is in the second layer.

According to an embodiment, the pinhole layer is spaced away from the image sensor.

According to an embodiment, the window is aligned with the pinhole.

According to an embodiment, the second layer comprises a thin-film transistor (TFT).

According to an embodiment, the TFT comprises a gate insulating layer; wherein the sidewall extends through the gate insulating layer.

According to an embodiment, the TFT comprises an interlayer dielectric (ILD); wherein the sidewall extends through the ILD.

According to an embodiment, the second layer comprises a planarization layer on the TFT and away from the support; wherein the sidewall extends through the planarization layer.

According to an embodiment, the TFT comprises a source electrode and a drain electrode; wherein the sidewall is electrically connected to the source electrode or the drain electrode.

According to an embodiment, the TFT comprises a source electrode and a drain electrode; wherein the sidewall, the source electrode and the drain electrode consist of the same material.

According to an embodiment, the display substrate further comprises the image sensor.

According to an embodiment, the image sensor is sandwiched between the support and the second layer, or the support is sandwiched between the image sensor and the second layer.

According to an embodiment, an end of the window away from the support has a larger area than an end of the window proximal to the support.

According to an embodiment, the window comprises a dielectric.

According to an embodiment, the window is not opaque to the light.

According to an embodiment, the sidewall comprises an electrically conductive material.

According to an embodiment, the first layer comprises a light emitter and the light is emitted by the light emitter.

According to an embodiment, the light emitter comprises a material that exhibits electroluminescence (EL).

According to an embodiment, the sidewall is electrically connected to the light emitter.

According to an embodiment, the sidewall and an electrode of the light emitter consist of the same material.

Disclosed herein is a display panel comprising any of the display substrates above.

Disclosed herein is a system comprising the display panel above, wherein the system is an e-book reader, a laptop computer, a computer monitor, an OLED panel, a mobile phone, a tablet computer, a television, a display screen, a digital photo frame, or a portable GPS system.

Disclosed herein is a method of making a display substrate of a display panel, the method comprising: forming a second layer on a support; forming a hole across a thickness of the second layer; forming a sidewall inside the hole; wherein the sidewall is configured to attenuate transmission of light through the sidewall.

According to an embodiment, the method further comprises forming a first layer; wherein the second layer is sandwiched between the first layer and the support.

According to an embodiment, the light is emitted by the display substrate.

According to an embodiment, the second layer comprises a thin-film transistor (TFT).

According to an embodiment, the TFT comprises a gate insulating layer; wherein the sidewall extends through the gate insulating layer.

According to an embodiment, the TFT comprises an interlayer dielectric (ILD); wherein the sidewall extends through the ILD.

According to an embodiment, the second layer comprises a planarization layer on the TFT and away from the support; wherein the sidewall extends through the planarization layer.

According to an embodiment, the TFT comprises a source electrode and a drain electrode; wherein the sidewall is electrically connected to the source electrode or the drain electrode.

According to an embodiment, the method further comprises disposing an image sensor to the support.

According to an embodiment, the image sensor is sandwiched between the support and the second layer, or the support is sandwiched between the image sensor and the second layer.

According to an embodiment, the method further comprises forming a window in the hole and optically coupled with the image sensor.

According to an embodiment, the sidewall surrounds the window.

According to an embodiment, an end of the window away from the support has a larger area than an end of the window proximal to the support.

According to an embodiment, the window comprises a dielectric.

According to an embodiment, the window is not opaque to the light.

According to an embodiment, the sidewall comprises an electrically conductive material.

According to an embodiment, forming the second layer comprises forming a source electrode and a drain electrode of a TFT and forming the sidewall, by depositing the same electrically conductive material and at the same time.

According to an embodiment, the first layer comprises a light emitter and the light is emitted by the light emitter.

According to an embodiment, the light emitter comprises a material that exhibits electroluminescence (EL).

According to an embodiment, the sidewall is electrically connected to the light emitter.

According to an embodiment, forming the second layer comprises forming an electrode to the light emitter and the sidewall, by depositing the same electrically conductive material and at the same time.

DETAILED DESCRIPTION

A display substrate of a display panel can perform fingerprint detection based on the principle of pinhole cameras. For example, light (e.g., light emitted by the display substrate, for example, by a light emitter such as an organic light emitting diode (OLED) in the display substrate) is directed toward a finger and reflected by the surface of the finger. The reflected light passes through a pinhole on the display substrate and forms an image of the friction ridges of the finger on an image sensor in the display substrate. The pinhole is not necessarily a physical hole of void space; instead it can include a window that allows at least some of the reflected light to pass through.

The image sensor, however, may receive light reflected on internal structures of the display substrate, in addition to the light directly from the finger. For example, a part of the light may reflect on the internal structures such as the gate, source electrode, drain electrode and active layer of thin-film transistors in the display substrate before reaching the image sensor. As a result, the image sensor sees a superposition of the image of the friction ridges and some image of the internal structures. The superposition may render detecting features of the fingerprint difficult. Light incident on the internal structures may adversely affect the function of the internal structures.

Figure 1:
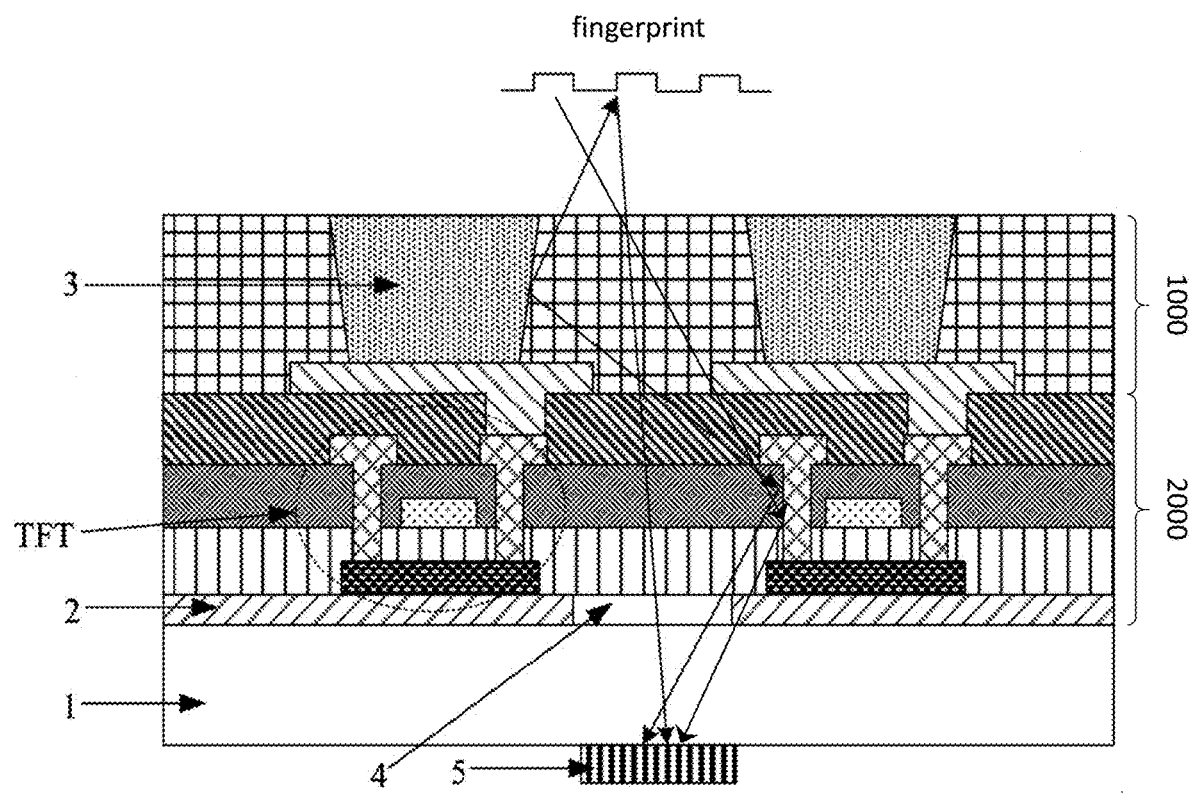
FIG. 1 and FIG. 2 each schematically show a sectional view of a display substrate of a display panel.
Figure 2:
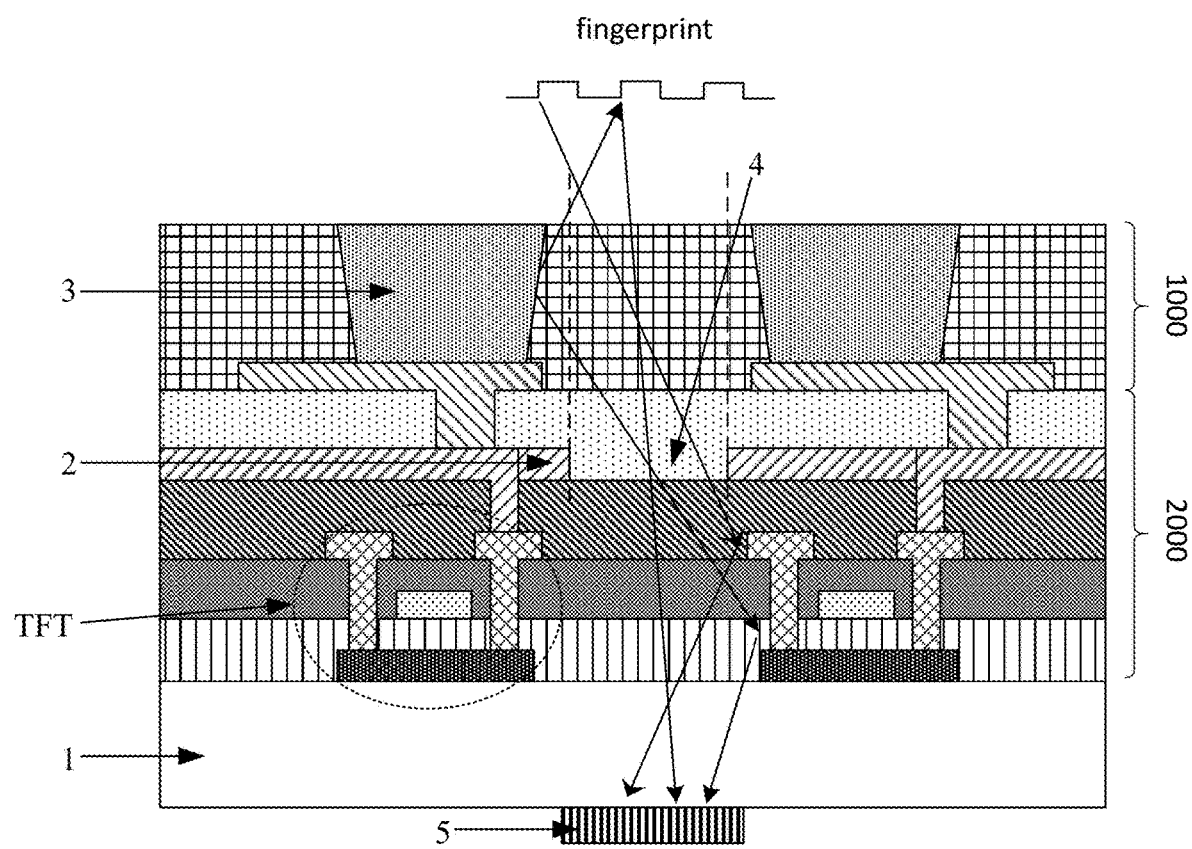

FIG. 1 and FIG. 2 each schematically show a sectional view of a display substrate of a display panel. The display substrate has a first layer 1000 and a second layer 2000. The first layer 1000 may include a light emitter 3. The second layer 2000 has structures such as a thin film transistor (TFT). A pinhole layer 2 with patterns defining a pinhole 4 may be sandwiched between a TFT and a support 1 of the display substrate, inside the second layer 2000, as in the example of FIG. 1. The term "sandwiched between" as used here does not require direct physical contact. For example, the pinhole layer 2 sandwiched between the TFT and the support 1 is not necessarily in direct physical contact with the TFT or the support 1. The pinhole layer 2 may be on a side of the TFT away from the support 1, inside the second layer 2000, as in the example of FIG. 2. The term "away from" does not require separation by a void. The pinhole layer 2 may include a layer of material that is essentially opaque to the light from the finger and the light from the substrate (e.g., from the light emitter 3).

As can be seen from FIG. 1 and FIG. 2, a part of the light emitted by the substrate (e.g., light emitter 3) or a part of the light from the finger may incident onto the TFT and reflected by various structures of the TFT (e.g., the gate 8, the source electrode 10, the drain electrode 11, and the active layer 6) before reaching an image sensor 5.

Figure 3:
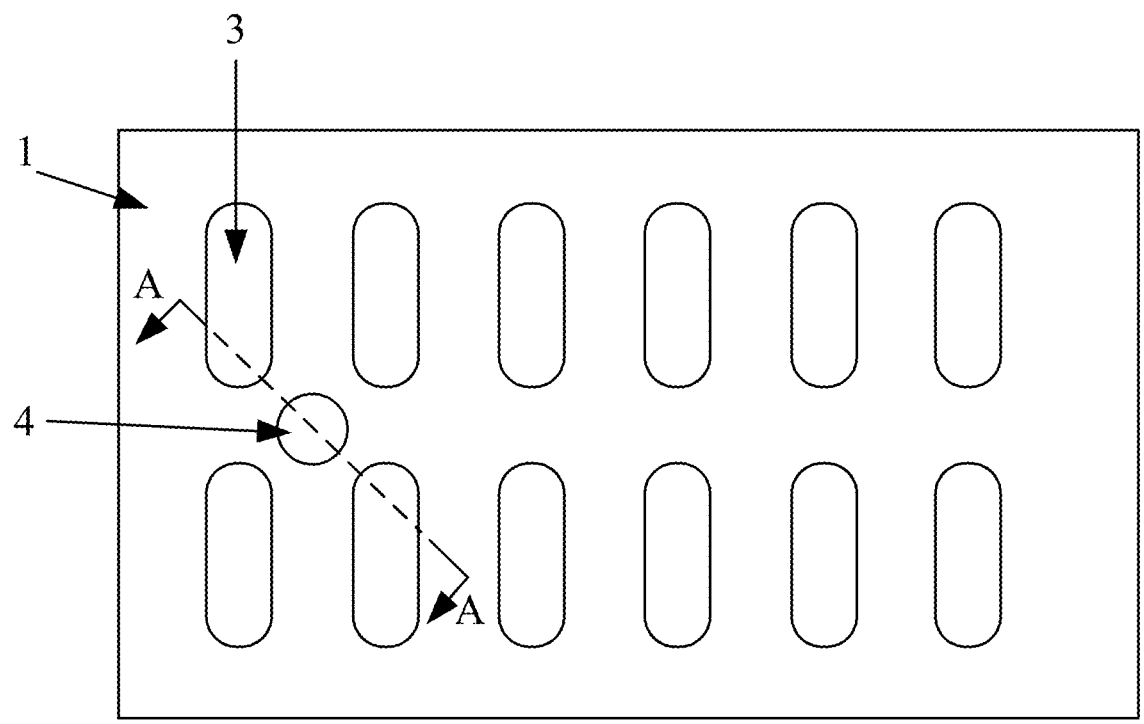
FIG. 3 shows an example of the positions of a light emitter in the display substrate and a pinhole in the display substrate relative to the support in the display substrate.
Figure 4:
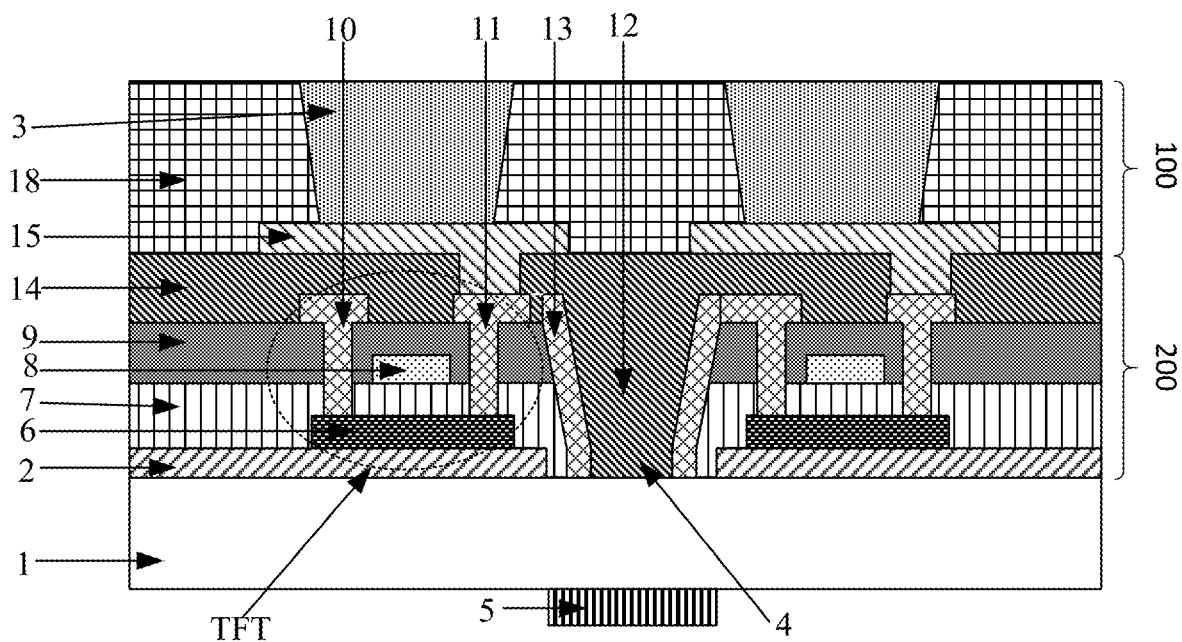
FIG. 4 schematically shows a sectional view along the A-A line in FIG. 3, according to an embodiment.

FIG. 3 shows an example of the positions of the light emitter 3 and the pinhole 4 relative to the support 1. FIG. 4 schematically shows a sectional view of the display substrate along the A-A line in FIG. 3, according to an embodiment. The display substrate includes an optional first layer 100, a second layer 200, and a support 1. The first layer 100 may include at least one light emitter 3. The light emitter 3 may include a material that exhibits electroluminescence (EL). For example, the light emitter 3 may be an OLED. The second layer 200 may be sandwiched between the first layer 100 and the support 1. The second layer 200 may include a TFT. The TFT may be either a top-gate TFT, or a bottom-gate TFT. In this example, the TFT is located on the display side of the support 1. The term "display side" as used herein with respect to a display substrate of a display panel is the side from which a user views a content on the display panel. The display substrate includes a window 12 extending through the second layer 200 and optically coupled with an image sensor 5. The window 12 may be aligned with the pinhole 4 if the pinhole layer 2 is present. Namely, an orthographic projection of the window 12 on the plane of the pinhole layer 2 is inside the pinhole 4. The window 12 may include a dielectric. The window 12 may be not opaque to the light. The window 12 may have a tapered shape such as a truncated prism or a truncated cone. For example, an end of the window 12 away from the support 1 has a larger area than an end of the window 12 proximal to the support 1. The display substrate also includes a sidewall 13 at least partially surrounding the window 12 (e.g., surrounding the window 12 along a part of the perimeter or the entire perimeter of the window 12, surrounding a section less than the full height or the entire height of the window 12 along the thickness direction of the second layer 200). The sidewall 13 is able to attenuate transmission of light (e.g., light emitted by the display substrate, for example, by the light emitter 3) through the sidewall 13. In an example, the sidewall 13 can reduce transmission of the light through the sidewall 13 by 50% of the power, 90% of the power, or 99% of the power.

The second layer 200 may include a pinhole layer 2, for example, located on the display side of the support 1. A pinhole 4 may be defined by the patterns in the pinhole layer 2. The pinhole layer 2 may be located at a side of the TFT away from the support 1, or may be sandwiched between the TFT and the support 1.

The display substrate may include an image sensor 5. The image sensor 5 may be sandwiched between the support 1 and the second layer 200, or the support 1 is sandwiched between the image sensor 5 and the second layer 200. The image sensor 5 may be optically coupled to the light from the finger through the pinhole 4 if the pinhole layer 2 is present. For example, the footprint of the pinhole 4 may overlap or be entirely inside the footprint of the image sensor 5. For example, the image sensor 5 may be aligned with the pinhole 4. Namely the orthographic projection of the light-receiving surface of the image sensor 5 on the plane of the pinhole layer 2 encompasses the pinhole 4. The image sensor 5 may be spaced apart by a certain distance from the pinhole layer 2 to facilitate pinhole imaging, if the pinhole layer 2 is present. Thus, the image sensor 5 may be on the side of the support 1 opposite from the display side.

Between a surface of the TFT farthest from the support 1 and a surface of the TFT closest to the support 1, the TFT may include an interlayer dielectric (ILD) 9. The sidewall 13 may extend through the ILD 9. For example, the second layer 200 may include the window 12 extending through the ILD 9 and the sidewall 13 may surround the window 12 and extend through the ILD 9.

In the example shown in FIG. 4, the TFT is a top-gate TFT, and the pinhole layer 2 is on a side of the TFT proximal to the support 1. The TFT includes a gate 8, an active layer 6, a source electrode 10, and a drain electrode 11. The active layer 6 is on the display side of the support 1. The TFT may have a buffering layer (not shown) below the active layer 6. The TFT includes a gate insulating layer 7 on a side of the active layer 6 away from the support 1, and the gate 8 is on a side of the gate insulating layer 7 away from the support 1. The TFT includes an ILD 9 on a side of the gate 8 away from the support 1. The ILD 9 and the gate insulating layer 7 have via holes that accommodate vias connecting the source electrode 10 and the drain electrode 11 respectively to the active layer 6. The source electrode 10 and the drain electrode 11 are on a side of the ILD 9 away from the support 1. The sidewall 13 may extend through the gate insulating layer 7. The sidewall 13 may extend through the ILD 9.

The second layer 200 may include a first planarization layer 14 on the TFT and away from the support 1. The first planarization layer 14 may have a via hole that accommodates a via connecting an anode 15 of the light emitter 3 and the drain electrode 11. The anode 15 is on a side of the first planarization layer 14 away from the support 1. The sidewall 13 may extend through the first planarization layer 14. The first layer 100 may include a pixel define layer (PDL) 18 that separates the light emitter 3 from other light emitters in the first layer 100.

Figure 5:
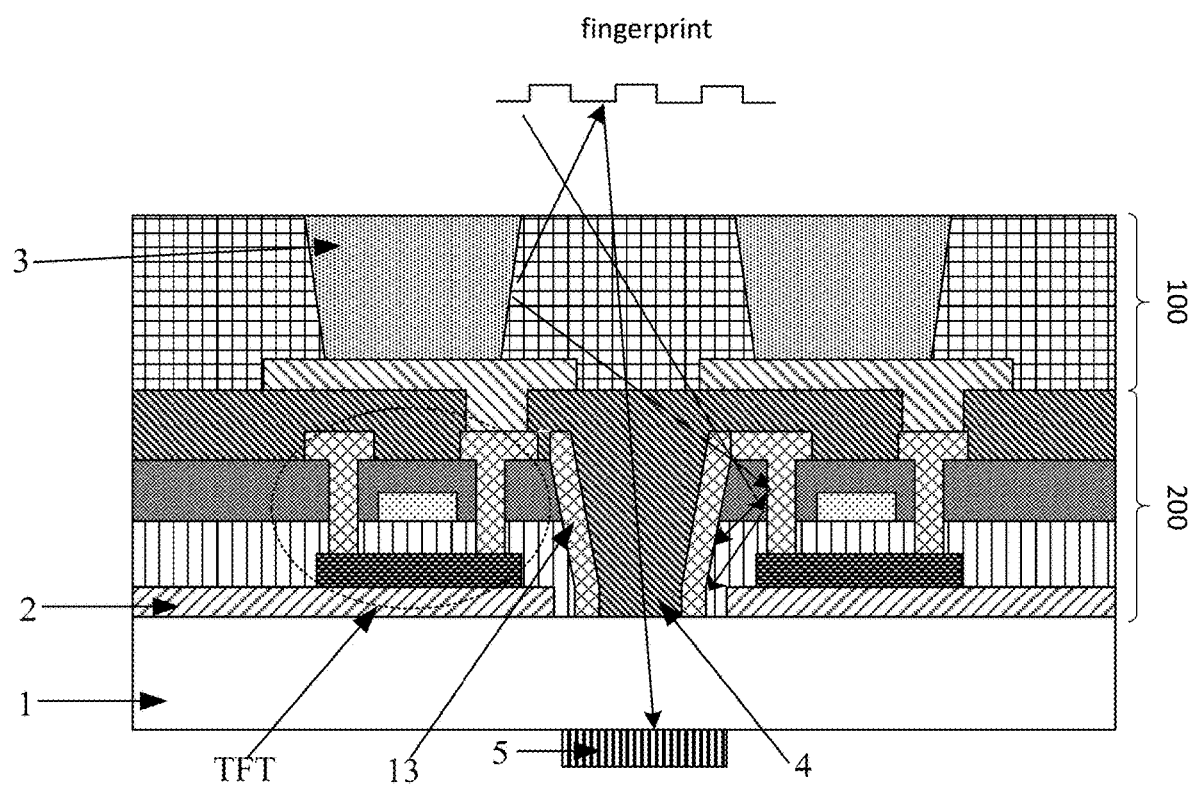
FIG. 5 schematically shows an optical path in the display substrate in FIG. 4.

FIG. 5 schematically shows an optical path in the display substrate in FIG. 4. As shown in FIG. 5, a part of the light may reach the structures (e.g., the TFT) in the second layer 200. The sidewall 13 attenuates transmission of reflected light from the structures in the second layer 200 through the sidewall 13, thereby reducing the amount of the reflected light from the structures reaching the image sensor 5.

The sidewall 13 may be formed in at the same time with the source electrode 10 and the drain electrode 11. Namely, the geometry of the sidewall 13, the source electrode 10 and the drain electrode 11 may be defined using the same mask in the same exposure in photolithography, and the sidewall 13, the source electrode 10 and the drain electrode 11 may be formed in the same deposition. For example, the sidewall 13, the source electrode 10 and the drain electrode 11 may be formed by deposition of the same electrically conductive material such as a metal (e.g., Au, Cu, Al).

Light reflected from the finger may travel in the window 12, reflect from the surface of the sidewall 13 and reach the image sensor 5. This light may add an essentially uniform background to the image of the finger captured by the image sensor 5 because the surface of the sidewall 13 is largely flat and monochromatic. The uniform background may facilitate fingerprint detection based on the image.

The sidewall 13 may be electrically connected to the source electrode 10 or the drain electrode 11.

The pinhole layer 2, if present, and the sidewall 13 may prevent light reflected from the structures in the second layer 200 from reaching the image sensor 5. For example, as shown in FIG. 4, because the sidewall 13 extends through both the gate insulating layer and the ILD 9 and surrounds the window 12, and the pinhole layer 2 is immediately below the TFT, the pinhole layer 2 and the sidewall 13 may block the light reflected from the TFT from reaching the image sensor 5.

Figure 6:
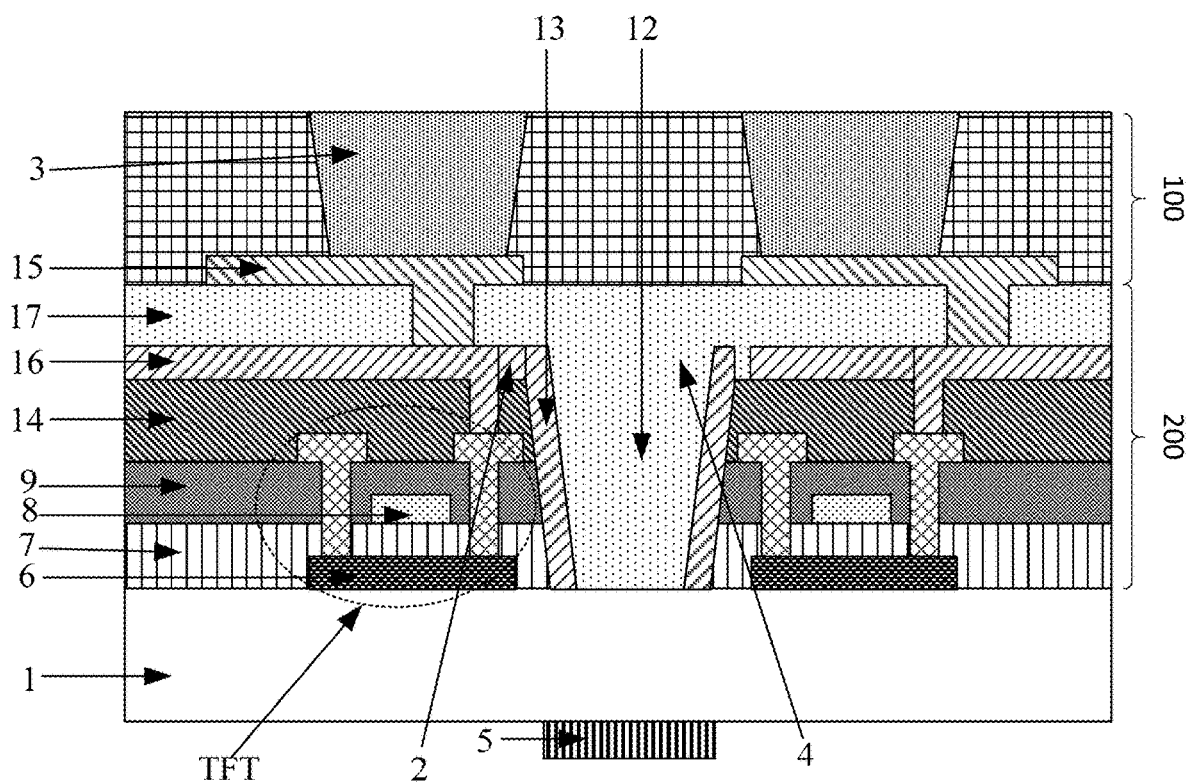
FIG. 6 schematically shows a sectional view along the A-A line in FIG. 3, according to an embodiment.

FIG. 6 schematically shows a sectional view along the A-A line in FIG. 3, according to an embodiment. In the example shown in FIG. 6, in contrast to FIG. 4, the anode 15 is indirectly connected to the drain electrode 11 through a transmission line 16 on the side of the TFT away from the support 1. The first planarization layer 14 may be on the side of the TFT away from the support 1 and between the transmission line 16, and the source electrode 10 and the drain electrode 11. The first planarization layer 14 may have a via hole that accommodate a via connecting the drain electrode 11 and the transmission line 16. The second layer 200 may include a second planarization layer 17 on a side of the transmission line 16 away from the support 1. The second planarization layer 17 may have a via hole that accommodates a via connecting the anode 15 to the transmission line 16. The anode 15 is disposed on a side of the second planarization layer 17 away from the support 1. The sidewall 13 may be electrically connected to the light emitter 3, through the transmission line 16 and the anode 15.

The layer with the transmission line 16 may also serve as the pinhole layer 2. Namely, the layer with the transmission line 16 may have patterns defining the pinhole 4. The patterns defining the pinhole 4 and the transmission line 16 may be formed at the same time. The patterns defining the pinhole 4 may or may not be connected to the transmission line 16.

Figure 7:
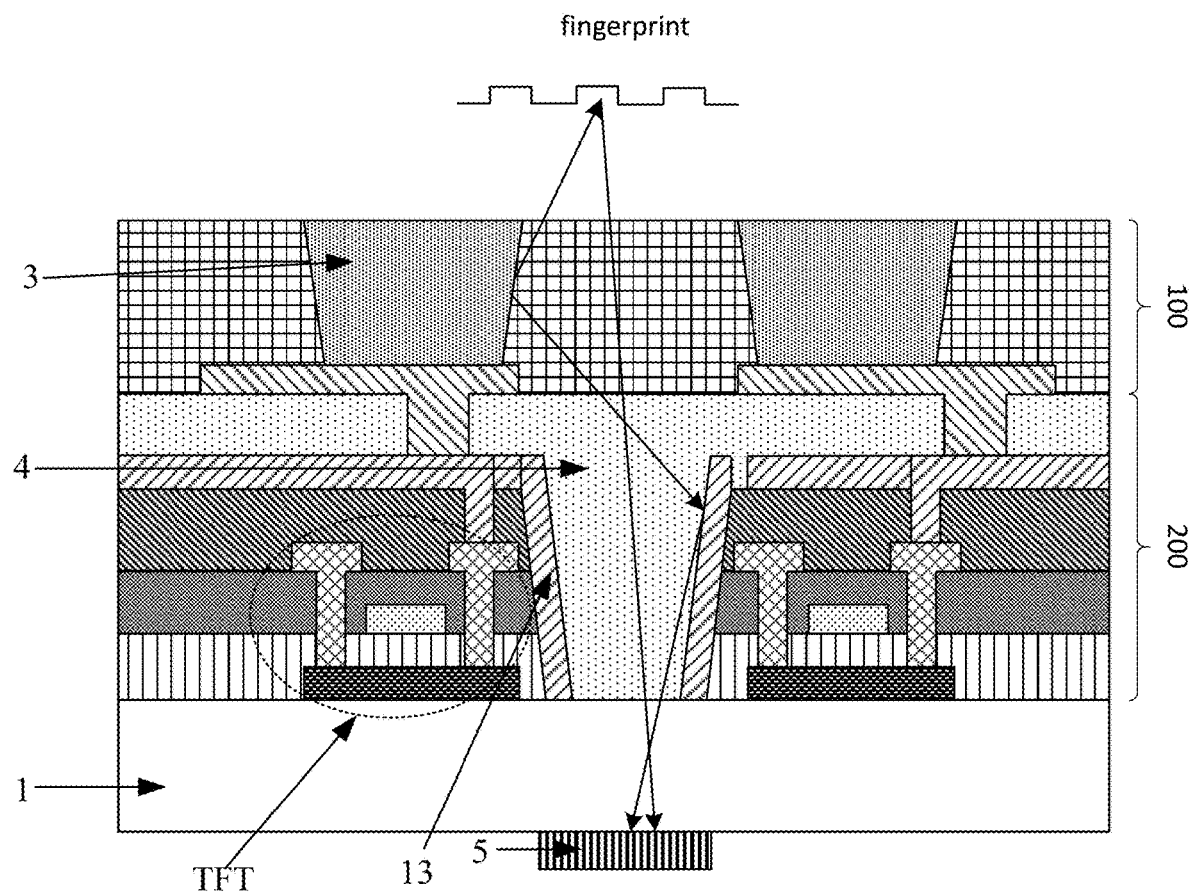
FIG. 7 schematically shows an optical path in the display substrate in FIG. 6.

FIG. 7 schematically shows an optical path in the display substrate in FIG. 6. As shown in FIG. 7, the sidewall 13 mainly blocks the light emitted from the display substrate (e.g., the light emitter 3) toward the TFT and the light reflected by the finger toward the TFT. As the amount of light directed toward the TFT is reduced by the sidewall 13, the amount of light reflected by the TFT is reduced, and in turn the amount of light reflected by the TFT and reaching the image sensor 5 is reduced.

The sidewall 13 may be formed at the same time with the transmission line 16. Namely, the geometry of the sidewall 13, the transmission line 16 and the patterns defining the pinhole 4, if present, may be defined using the same mask in the same exposure in photolithography, and the sidewall 13, the transmission line 16 and the patterns defining the pinhole 4, if present, may be formed in the same deposition. For example, the sidewall 13, the transmission line 16 and the patterns defining the pinhole 4, if present, may be formed by deposition of the same electrically conductive material such as a metal (e.g., Au, Cu, Al).

The pinhole layer 2, if present, the transmission line 16 and the sidewall 13 may prevent light from reaching the TFT, and hence eliminate any light reflected from the TFT into the image sensor 5.

In addition, in the example shown in FIG. 6, the sidewall 13 extending through the first planarization layer 14 may protect the active layer 6 in the TFT against changes of its electrical characteristics due to illumination.

Figure 8:
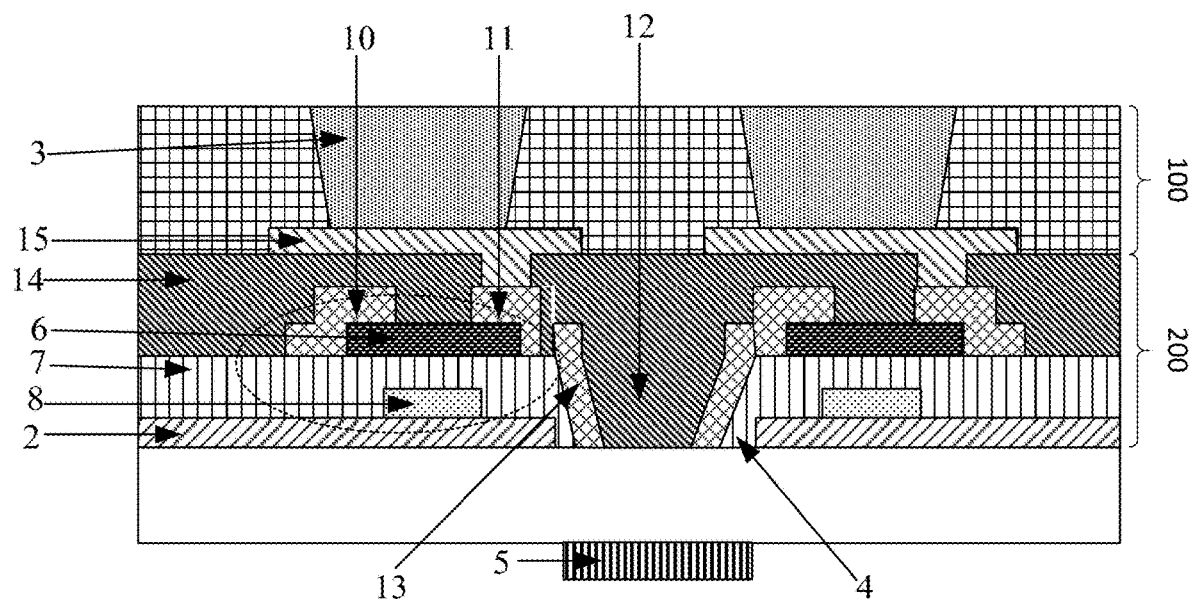
FIG. 8 schematically shows a sectional view along the A-A line in FIG. 3, according to an embodiment.

FIG. 8 schematically shows a sectional view along the A-A line in FIG. 3, according to an embodiment. In the example shown in FIG. 8, in contrast to FIG. 4, the TFT is a bottom-gate TFT. Namely, the gate 8 is on the opposite side of the gate insulating layer 7 from the source electrode 10 and the drain electrode 11. The active layer 6 is on the side of the gate insulating layer 7 away from the support 1. The source electrode 10 and the drain electrode 11 are on a side of the active layer 6 away from the support 1 and are connected to the active layer 6. The sidewall 13 may extend through the gate insulating layer 7. The sidewall 13 can be formed at the same time with the source electrode 10 and the drain electrode 11. The pinhole layer 2, the first planarization layer 14, the anode 15 and the other structures in FIG. 8 are similar to those shown in FIG. 4.

Figure 9:
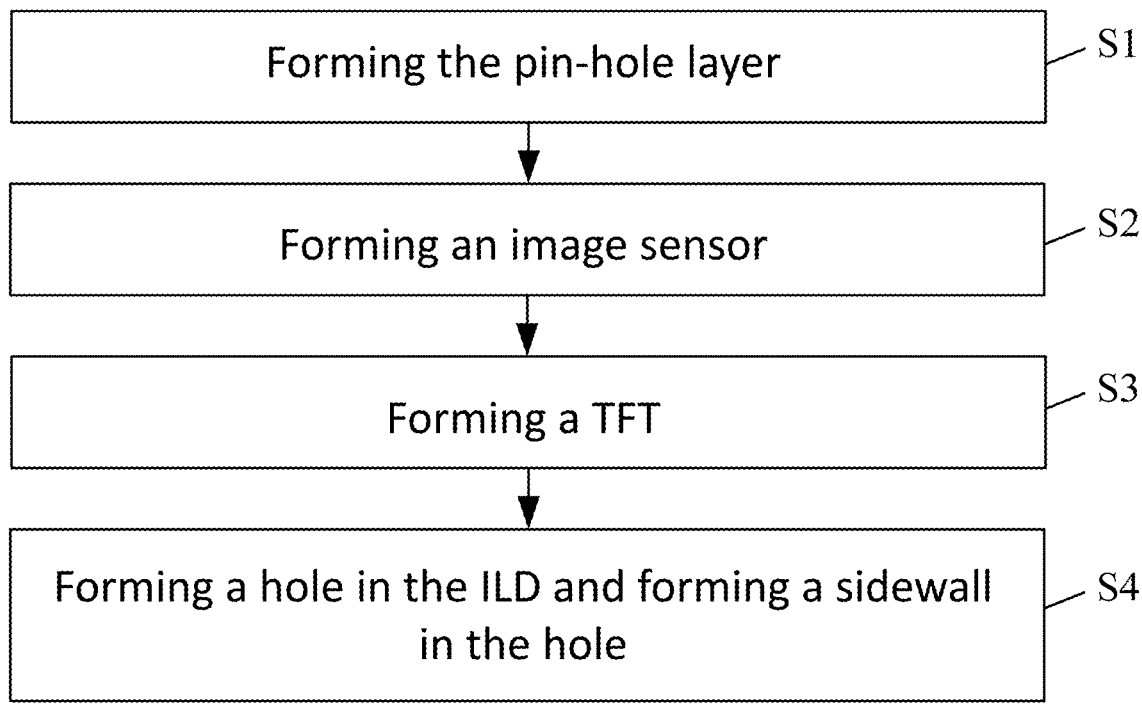
FIG. 9 is a flowchart of a method for manufacturing a display substrate of a display panel disclosed herein, according to an embodiment.

FIG. 9 is a flowchart of a method for manufacturing a display substrate disclosed herein, according to an embodiment.

In step S1, the pinhole layer 2 is formed. The pinhole layer 2 may be on the display side of the support 1.

In step S2, the image sensor 5 is formed. The image sensor 5 may be optically coupled with the pinhole 4.

In step S3, a TFT is formed. The TFT is on the display side of the support 1. The TFT has the ILD 9.

In step S4, a hole is formed in the ILD 9, where the hole is aligned with the pinhole 4; and the sidewall 13 is formed in the hole.

Figure 10:
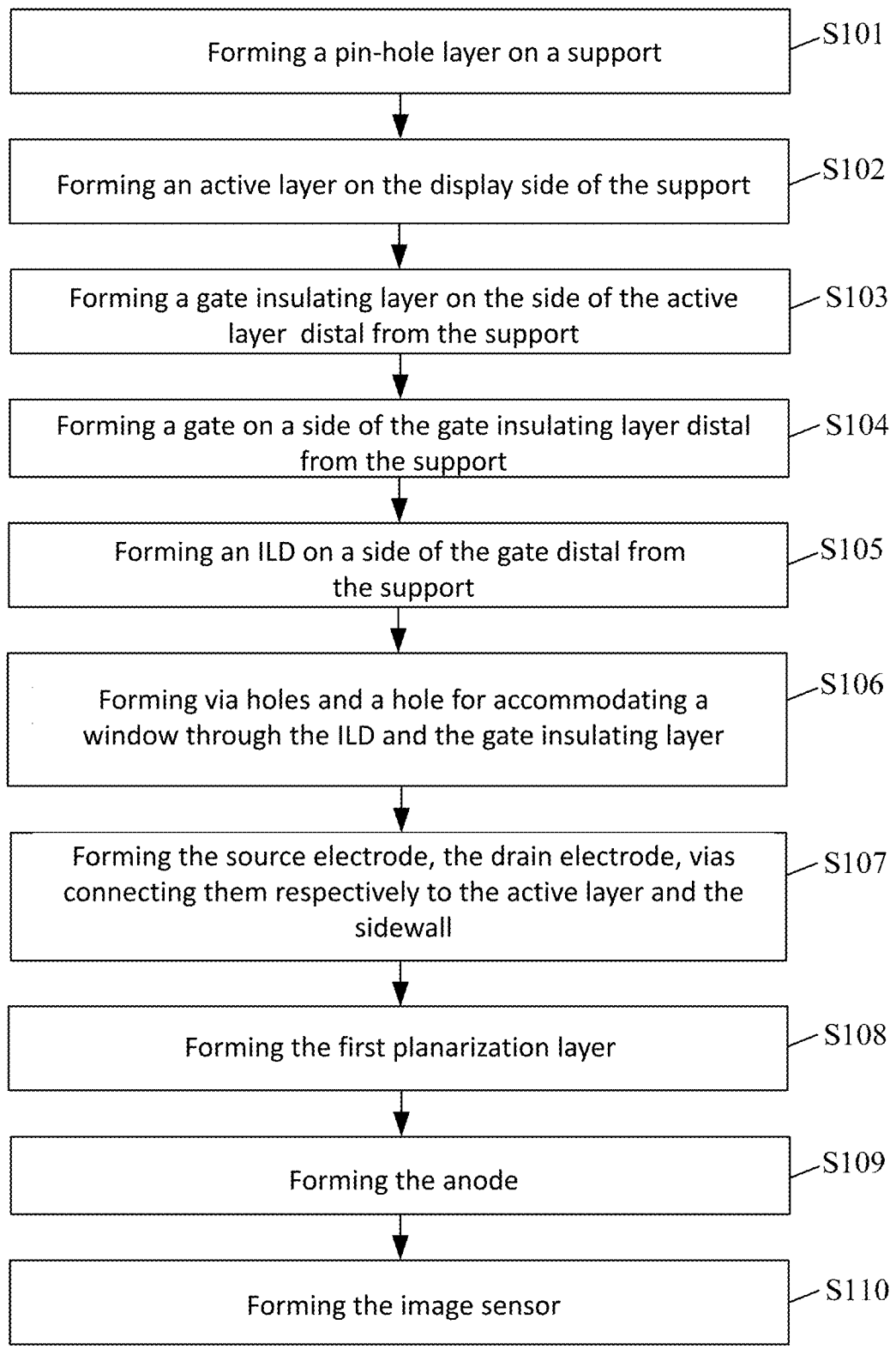
FIG. 10 is a flowchart of a method for manufacturing a display substrate disclosed herein, according to an embodiment.

FIG. 10 is a flowchart of a method for manufacturing a display substrate disclosed herein, according to an embodiment.

In step S101, the pinhole layer 2 is formed on the support 1. Forming the pinhole layer 2 may include forming patterns defining the pinhole 4 using a light-shielding material such as a resin or a metal. Forming the pinhole layer 2 may further include forming an insulating layer on the patterns defining the pinhole 4.

In step S102, the active layer 6 is formed on the display side the support 1.

In step S103, the gate insulating layer 7 is formed on the side of the active layer 6 away from the support 1.

In step S104, the gate 8 is formed on a side of the gate insulating layer 7 away from the support 1.

In step S105, the ILD 9 is formed on a side of the gate 8 away from the support 1.

Figure 11A:
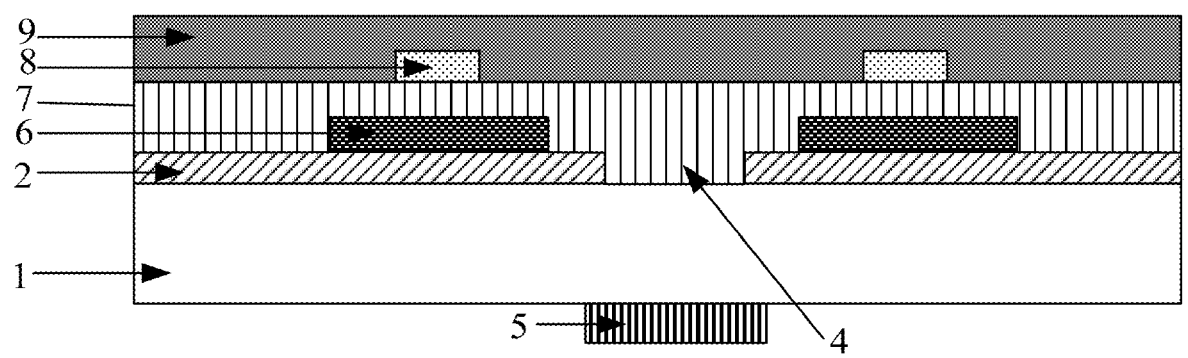
FIG. 11A is a schematic view showing the intermediate structure of the display substrate after performing steps S101 to S105 in FIG. 10.

FIG. 11A is a schematic view showing the intermediate structure of the display substrate after performing steps S101 to S105. As shown in FIG. 11A, the gate insulating layer 7 and the ILD 9 are not yet patterned.

In step S106, via holes through the gate insulating layer 7 and the ILD 9 are formed where the active layer 6 is exposed in the via holes; a hole through the gate insulating layer 7 and the ILD 9 to accommodate the window 12 is also formed where this hole is aligned with the pinhole 4 and the support 1 is exposed in this hole.

Figure 11B:
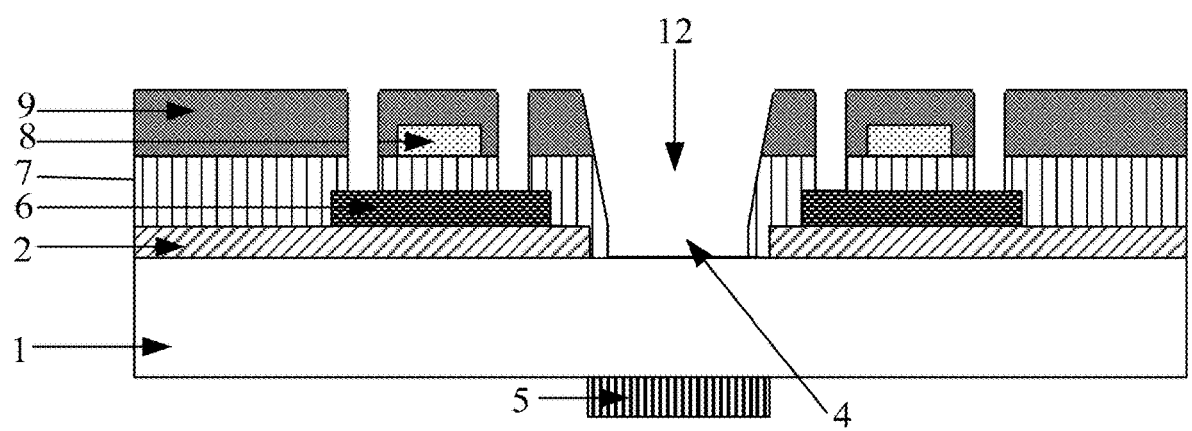
FIG. 11B is a schematic view showing the intermediate structure of the display substrate after performing step S106 in FIG. 10.

FIG. 11B is a schematic view showing the intermediate structure of the display substrate after performing step S106. As shown in FIG. 11B, the gate insulating layer 7 and the ILD 9 are patterned.

The holes through the gate insulating layer 7 and the ILD 9 may be formed by dry etching. Alternatively, the holes through the gate insulating layer 7 and the ILD 9 may be formed by wet etching, in which the active layer 6 and the support 1 serve as etch stop.

Step S107, the source electrode 10, the drain electrode 11, vias connecting them respectively to the active layer 6 and the sidewall 13 are formed. The sidewall 13 is in the hole for accommodating the window 12. The vias are in the via holes. The source electrode 10 and the drain electrode 11 are on the side of the active layer 6 away from the support 1.

Figure 11C:
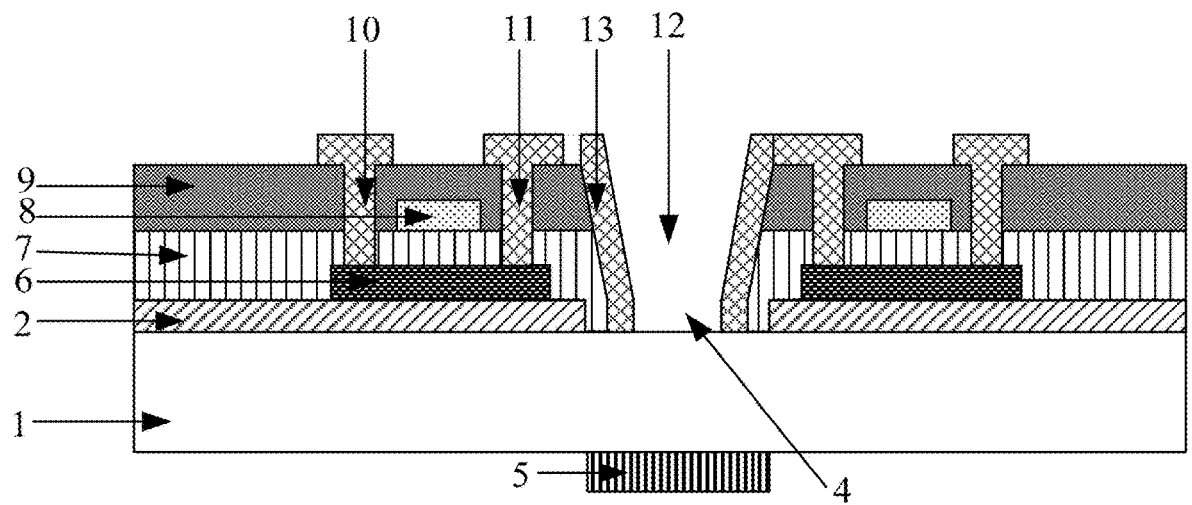
FIG. 11C is a schematic view showing the intermediate structure of the display substrate after performing step S107 in FIG. 10.

FIG. 11C is a schematic view showing the intermediate structure of the display substrate after performing step S107.

In step S108, the first planarization layer 14 is formed. A via hole may be open in the first planarization layer 14 to accommodate a via connecting the anode 15 and the drain electrode 11. The material of the first planarization layer 14 fills the hole through the gate insulating layer 7 and the ILD 9, forming the window 12 therein.

In step S109, the anode 15 is formed on the first planarization layer 14 and with a via in the via hole in the first planarization layer 14 and connecting the anode 15 and the drain electrode 11.

In step S110, the image sensor 5 is formed. Step S110 may be performed after step S109, before step S101, or between any steps as appropriate.

Figure 12:
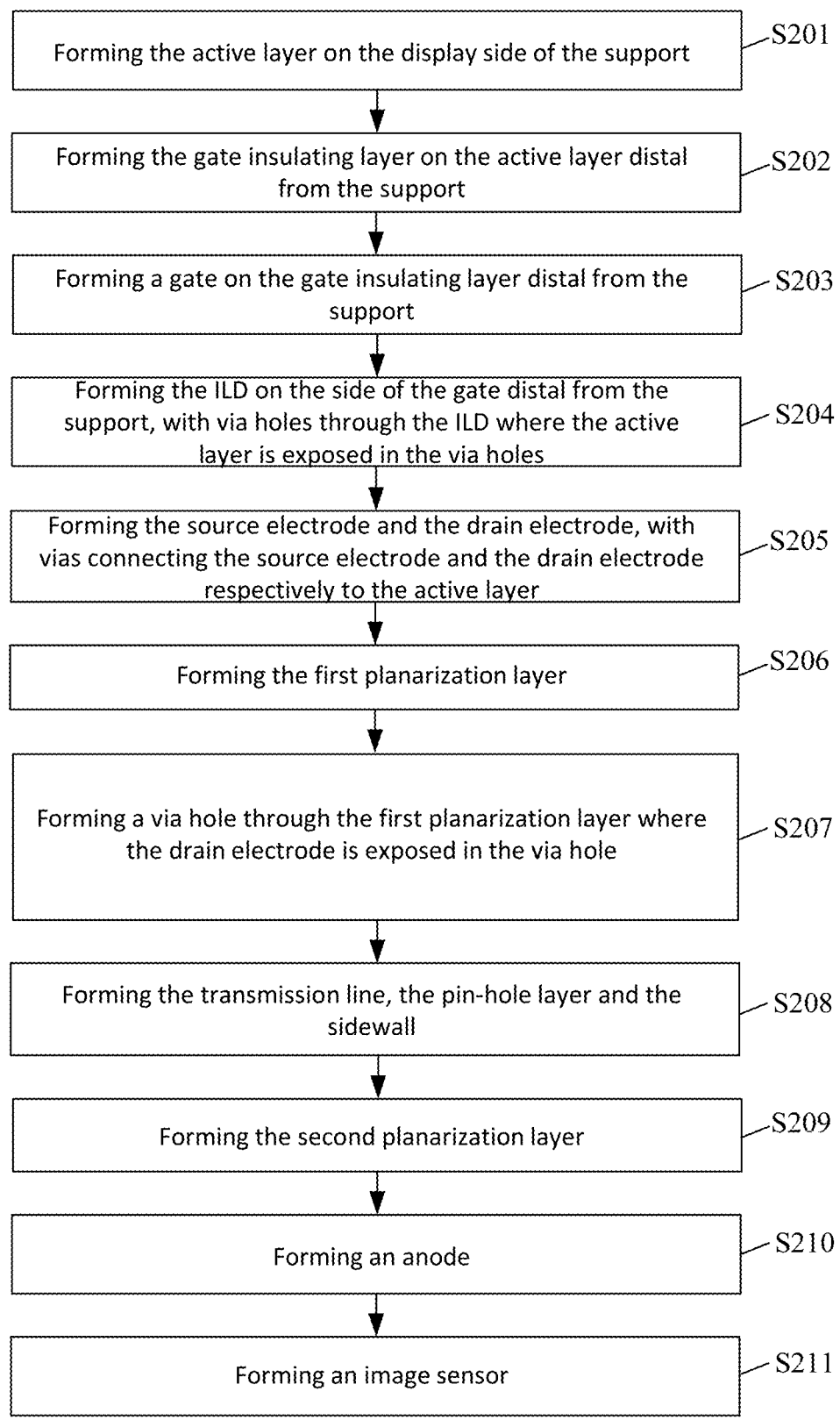
FIG. 12 is a flowchart of a method for manufacturing a display substrate disclosed herein, according to an embodiment.

FIG. 12 is a flowchart of a method for manufacturing a display substrate disclosed herein, according to an embodiment.

In step S201, the active layer 6 is formed on the display side the support 1.

In step S202, the gate insulating layer 7 is formed on a side of the active layer 6 away from the support 1.

In step S203, the gate 8 is formed on a side of the gate insulating layer 7 away from the support 1.

In step S204, the ILD 9 is formed on a side of the gate 8 away from the support 1, with via holes through the ILD 9 where the active layer 6 is exposed in the via holes.

In step S205, the source electrode 10 and the drain electrode 11 are formed on a side of the ILD 9 away from the support 1, with vias connecting the source electrode 10 and the drain electrode 11 respectively to the active layer 6.

In step S206, the first planarization layer 14 is formed.

Figure 13A:
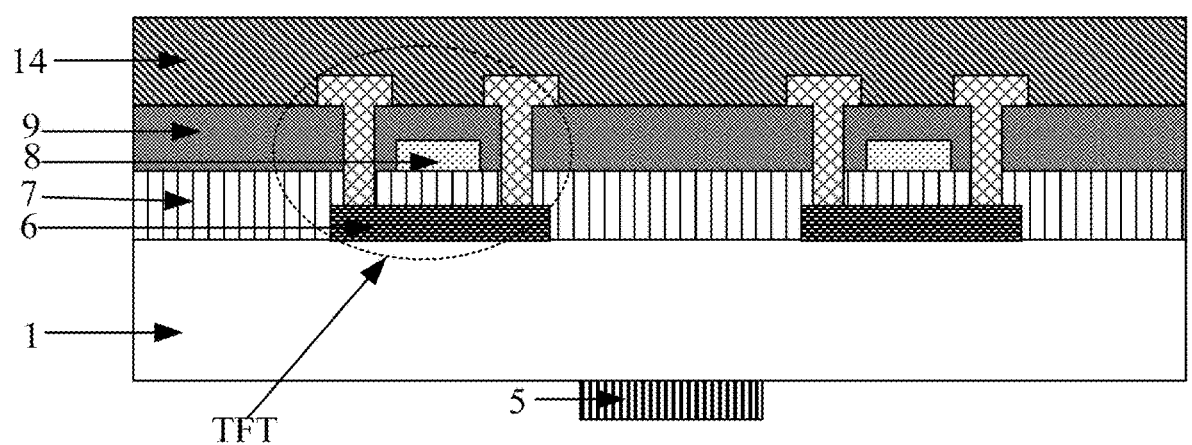
FIG. 13A is a schematic view showing the intermediate structure of the display substrate after performing steps S201 to S206 in FIG. 12.

FIG. 13A is a schematic view showing the intermediate structure of the display substrate after performing steps S201 to S206.

In step S207, a via hole through the first planarization layer 14 is formed where the drain electrode 11 is exposed in the via hole; a hole through the first planarization layer 14, the gate insulating layer 7 and the ILD 9 to accommodate the window 12 is also formed where this hole is aligned with the pinhole 4 and the support 1 is exposed in this hole.

Figure 13B:
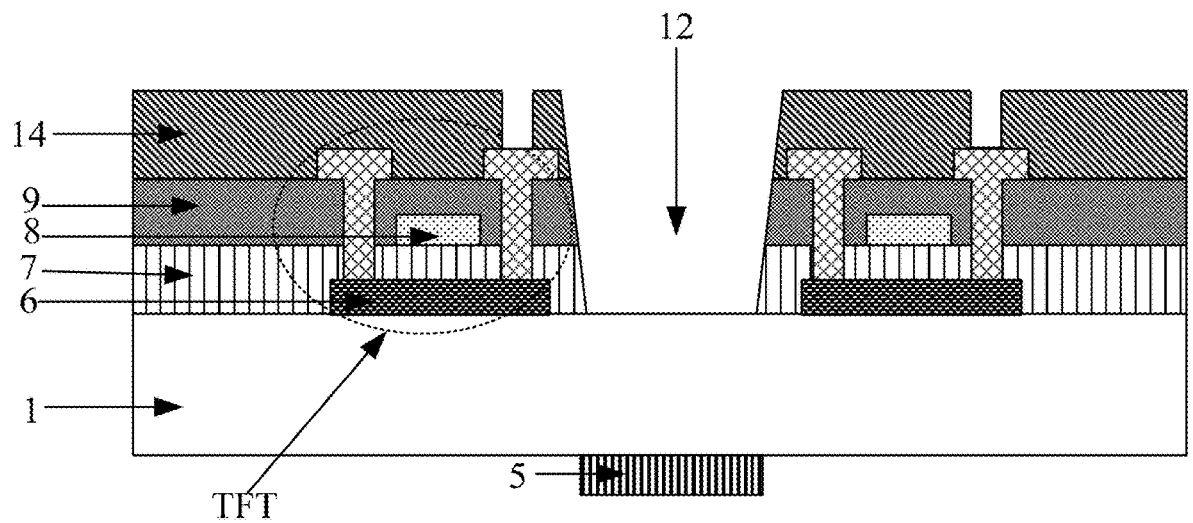
FIG. 13B is a schematic view showing an intermediate structure of the display substrate after performing step S207 in FIG. 12.

FIG. 13B is a schematic view showing an intermediate structure of the display substrate after performing step S207.

In step S208, the transmission line 16, the pinhole layer 2, and the sidewall 13 are formed. The sidewall 13 is in the hole for accommodating the window 12. The transmission line 16 is connected to the drain electrode 11 by a via in the via hole through the first planarization layer 14.

Figure 13C:
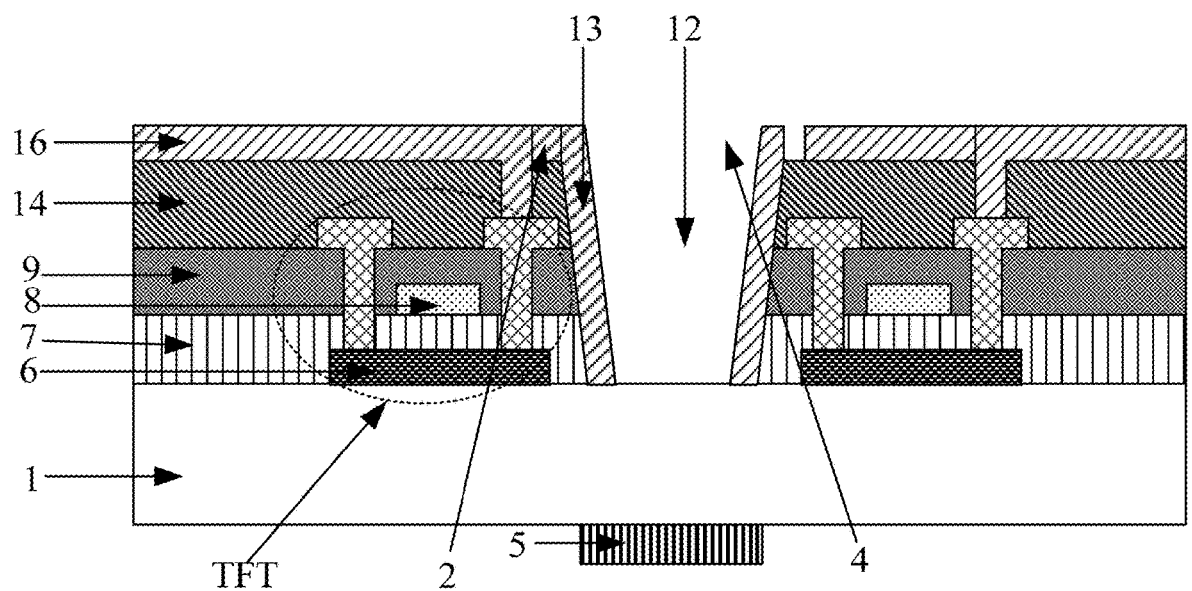
FIG. 13C is a schematic view showing an intermediate structure of the display substrate after performing step S208 in FIG. 12.

FIG. 13C is a schematic view showing an intermediate structure of the display substrate after performing step S208.

In step S209, the second planarization layer 17 is formed. A via hole may be open in the second planarization layer 17 to accommodate a via connecting the anode 15 and the transmission line 16. The material of the second planarization layer 17 fills the hole through the first planarization layer 14, the gate insulating layer 7 and the ILD 9, forming the window 12 therein.

In step S210, the anode 15 is formed on the second planarization layer 17 and with a via in the via hole in the second planarization layer 17 and connecting the anode 15 and the transmission line 16.

In step S211, the image sensor 5 is formed. Step S211 may be performed after step S210, before step S201, or between any steps as appropriate.

Figure 14:
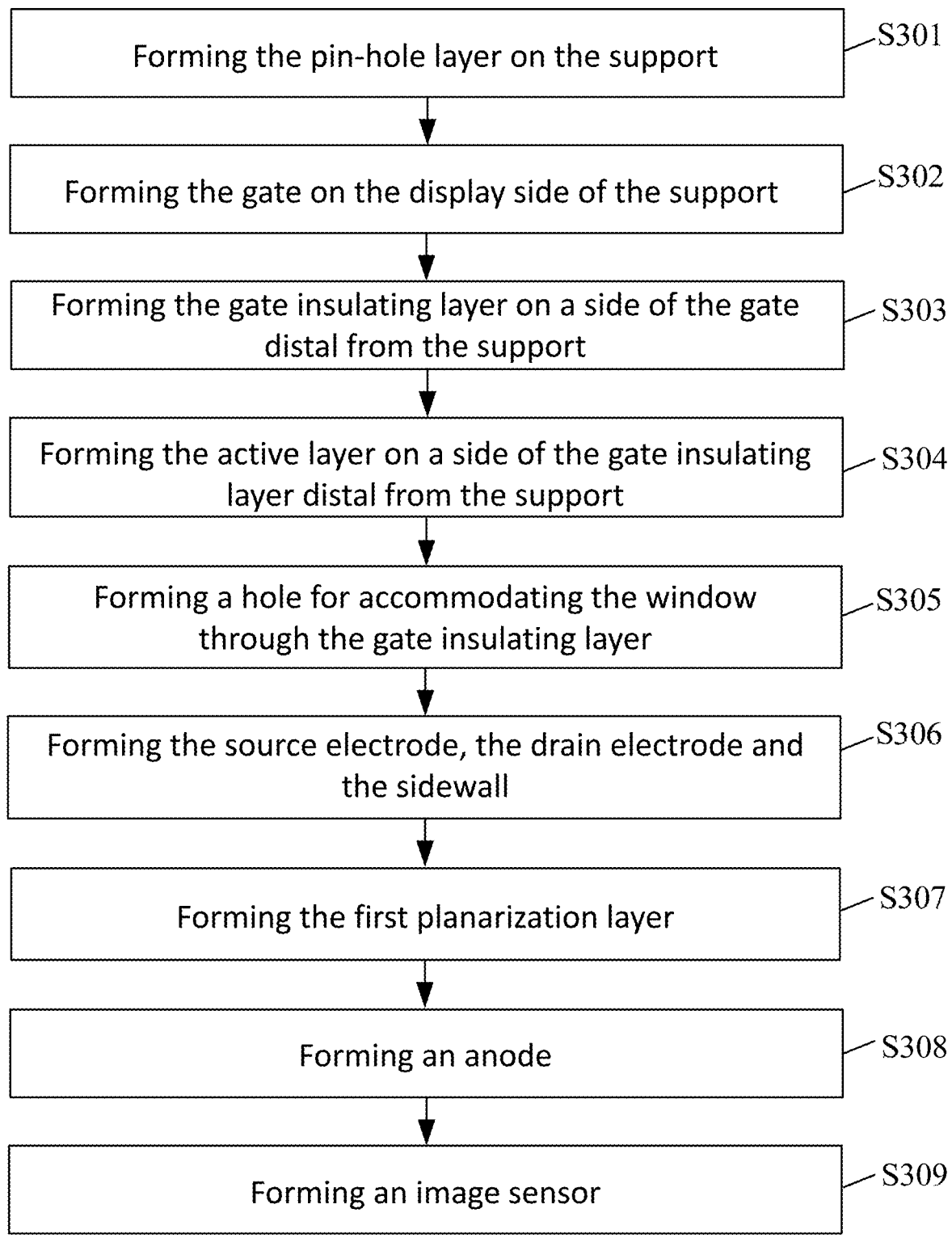
FIG. 14 is a flowchart of a method for manufacturing a display substrate disclosed herein, according to an embodiment.

FIG. 14 is a flowchart of a method for manufacturing a display substrate disclosed herein, according to an embodiment.

In step S301, the pinhole layer 2 is formed on the support 1.

In step S302, the gate 8 is formed on the display side of the support 1.

In step S303, the gate insulating layer 7 is formed on the side of the gate 8 away from the support 1.

In step S304, the active layer 6 is formed on the side of the gate insulating layer 7 away from the support 1.

In step S305, a hole through the gate insulating layer 7 to accommodate the window 12 is formed where this hole is aligned with the pinhole 4 and the support 1 is exposed in this hole.

Figure 15A:
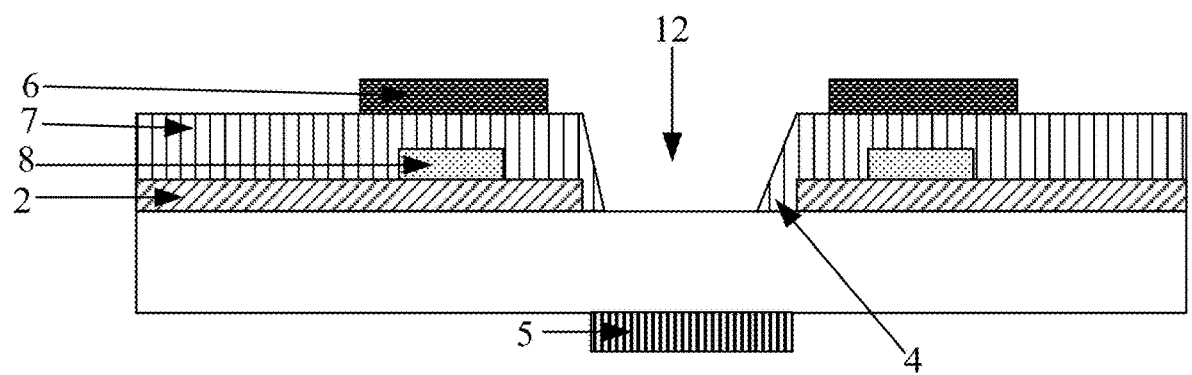
FIG. 15A is a schematic view showing an intermediate structure of the display substrate obtained after performing steps S301 to S305 in FIG. 14.

FIG. 15A is a schematic view showing an intermediate structure of the display substrate after performing steps S301 to S305.

In step S306, the source electrode 10 and the drain electrode 11 are formed on a side of the active layer 6 away from the support 1, and the sidewall 13 is formed in the hole through the gate insulating layer 7. The source electrode 10 and the drain electrode 11 are both connected to the active layer 6.

Figure 15B:
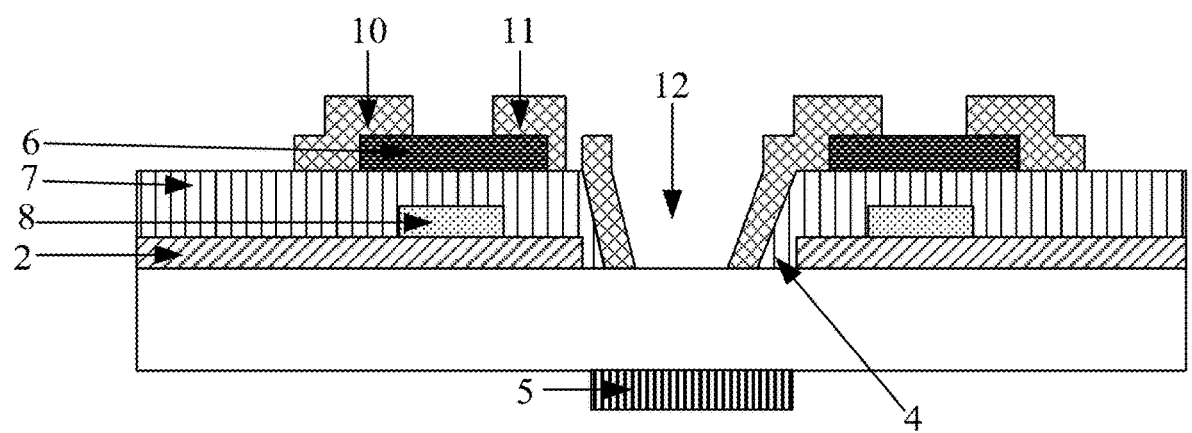
FIG. 15B is a schematic view showing an intermediate structure of the display substrate after performing step S306 in FIG. 14.

FIG. 15B is a schematic view showing an intermediate structure of the display substrate after performing step S306.

In step S307, the first planarization layer 14 is formed with a via hole through the first planarization layer 14 to accommodate a via connecting the drain electrode 11 to the anode 15. The material of the first planarization layer 14 fills the hole through the gate insulating layer 7, forming the window 12 therein.

In step S308, the anode 15 is formed, with the via connecting the drain electrode 11 to the anode 15.

In step S309, the image sensor 5 is formed. Step S309 may be performed after step S308, before step S301, or between any steps as appropriate.

Figure 16:
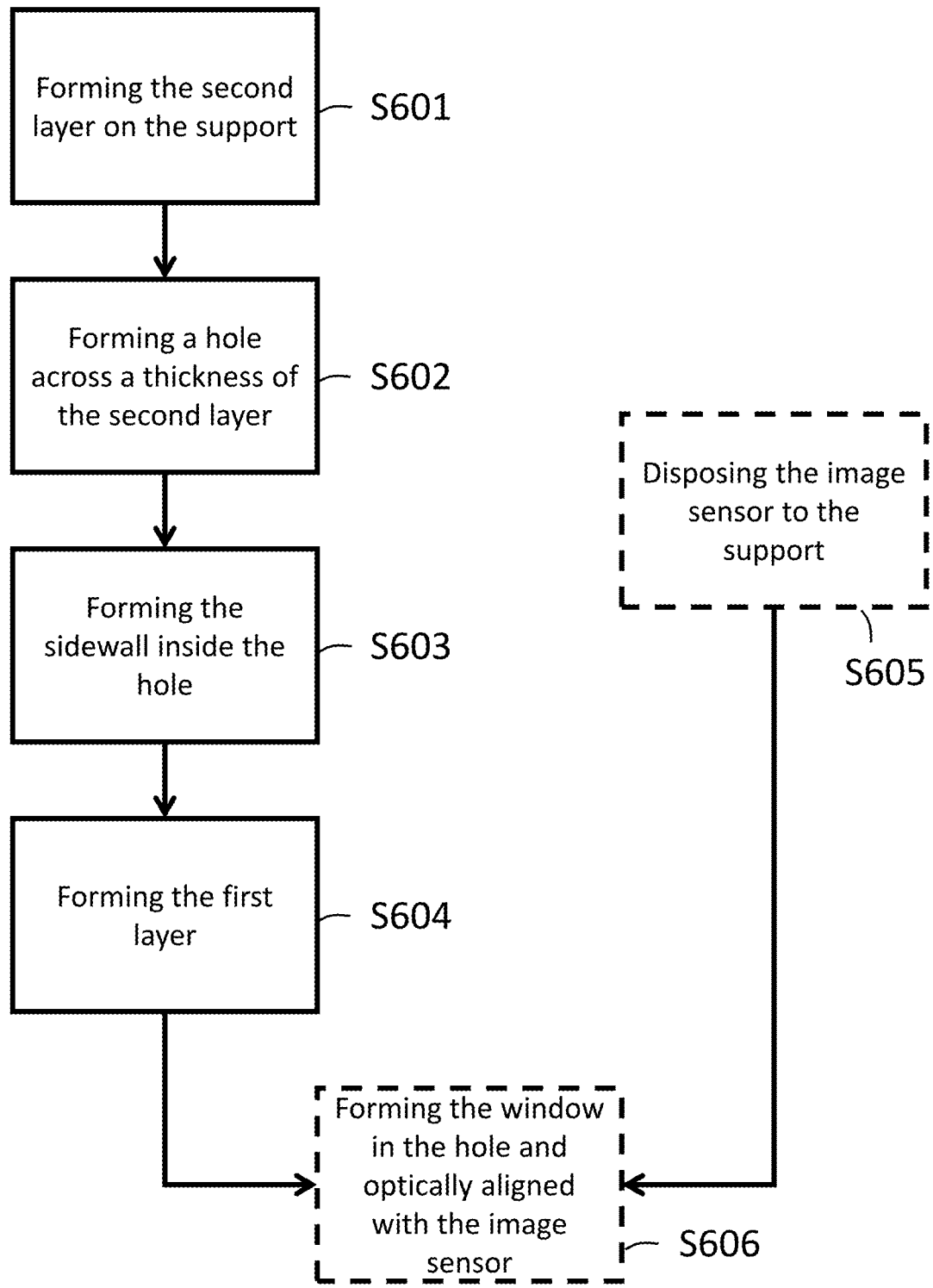
FIG. 16 shows a flowchart for a method according to an embodiment.

FIG. 16 shows a flowchart for a method according to an embodiment. In step S601, the second layer 200 is formed on the support 1. In step S602, a hole across a thickness of the second layer 200 is formed. The hole may extend across a part of the total thickness of the second layer 200 or the entirety of the total thickness of the second layer 200. In step S603, the sidewall 13 is formed inside the hole. In optional step S604, the first layer 100 is formed. The first layer 100 may include the light emitter 3. The second layer 200 may be sandwiched between the first layer 100 and the support 1.

In optional step S605, the image sensor is disposed to the support 1. Step S605 may be performed before step S601, after step S604, or anywhere between steps S601 to S604 as appropriate.

In optional step S606, the window 12 is formed in the hole and optically coupled with the image sensor 5.

The display panel including any of the display substrates disclosed herein may be a part of any suitable system, such as an e-book reader, a laptop computer, a computer monitor, an OLED panel, a mobile phone, a tablet computer, a television, a display screen, a digital photo frame, a portable GPS system, or the like.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A display substrate comprising:
   a support;
   a second layer on the support;
   a window extending through the second layer and optically coupled with an image sensor;
   a sidewall at least partially surrounding the window;
   wherein the sidewall is configured to attenuate transmission of light through the sidewall;
   wherein the second layer comprises a thin-film transistor (TFT).

2. The display substrate of claim 1, further comprising a pinhole layer with patterns defining a pinhole.

3. The display substrate of claim 2, wherein the window is optically coupled with the image sensor through the pinhole.

4. The display substrate of claim 2, wherein the pinhole layer comprises a layer of material that is opaque to the light.

5. The display substrate of claim 2, wherein the pinhole layer is in the second layer.

6. The display substrate of claim 2, wherein the pinhole layer is spaced away from the image sensor.

7. The display substrate of claim 2, wherein the window is aligned with the pinhole.

8. The display substrate of claim 1, wherein the TFT comprises a gate insulating layer; wherein the sidewall extends through the gate insulating layer.

9. The display substrate of claim 1, wherein the TFT comprises an interlayer dielectric (ILD); wherein the sidewall extends through the ILD.

10. The display substrate of claim 1, wherein the second layer comprises a planarization layer on the TFT and away from the support; wherein the sidewall extends through the planarization layer.

11. The display substrate of claim 1, wherein the TFT comprises a source electrode and a drain electrode; wherein the sidewall is electrically connected to the source electrode or the drain electrode.

12. The display substrate of claim 1, wherein the TFT comprises a source electrode and a drain electrode; wherein the sidewall, the source electrode and the drain electrode consist of the same material.

13. The display substrate of claim 1, further comprising the image sensor.

14. The display substrate of claim 13 wherein the image sensor is sandwiched between the support and the second layer, or the support is sandwiched between the image sensor and the second layer.

15. The display substrate of claim 1, wherein an end of the window away from the support has a larger area than an end of the window proximal to the support.

16. The display substrate of claim 1, wherein the window is not opaque to the light.

17. A display panel, comprising the display substrate of claim 1.

18. A system comprising the display panel of claim 17, wherein the system is an e-book reader, a laptop computer, a computer monitor, an OLED panel, a mobile phone, a tablet computer, a television, a display screen, a digital photo frame, or a portable GPS system.

19. A method of making a display substrate of a display panel, the method comprising:
forming a second layer on a support;
forming a hole across a thickness of the second layer;
forming a sidewall inside the hole;
wherein the sidewall is configured to attenuate transmission of light through the sidewall;
wherein the second layer comprises a thin-film transistor (TFT).

20. A display substrate comprising:
a support;
a second layer on the support;
a window extending through the second layer and optically coupled with an image sensor;
a sidewall at least partially surrounding the window;
a pinhole layer with patterns defining a pinhole;
wherein the sidewall is configured to attenuate transmission of light through the sidewall;
wherein the pinhole layer is in the second layer.

* * * * *